(12) United States Patent
Umemoto

(10) Patent No.: US 9,607,927 B2
(45) Date of Patent: Mar. 28, 2017

(54) SEMICONDUCTOR DEVICE

(71) Applicant: Rohm Co., Ltd., Kyoto (JP)

(72) Inventor: Kiyotaka Umemoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/624,677

(22) Filed: Feb. 18, 2015

(65) Prior Publication Data
US 2015/0243585 A1 Aug. 27, 2015

(30) Foreign Application Priority Data

Feb. 21, 2014 (JP) ................................ 2014-032003

(51) Int. Cl.
*H01L 23/48* (2006.01)
*H01L 25/16* (2006.01)
(Continued)

(52) U.S. Cl.
CPC ........ *H01L 23/481* (2013.01); *G01C 19/5783* (2013.01); *H01L 25/0657* (2013.01); *H01L 25/16* (2013.01); *H01L 24/05* (2013.01); *H01L 24/06* (2013.01); *H01L 24/13* (2013.01); *H01L 24/14* (2013.01); *H01L 24/16* (2013.01); *H01L 24/17* (2013.01); *H01L 24/94* (2013.01); *H01L 24/97* (2013.01); *H01L 2224/0401* (2013.01); *H01L 2224/05009* (2013.01); *H01L 2224/0557* (2013.01); *H01L 2224/06181* (2013.01); *H01L 2224/131* (2013.01); *H01L 2224/13025* (2013.01); *H01L 2224/14517* (2013.01); *H01L 2224/16145* (2013.01); *H01L 2224/16265* (2013.01); *H01L 2224/17051* (2013.01); *H01L 2224/17181* (2013.01); *H01L 2224/94* (2013.01); *H01L 2224/97* (2013.01); *H01L 2225/06513* (2013.01); *H01L 2225/06541* (2013.01); *H01L 2924/12041* (2013.01); *H01L 2924/13091* (2013.01); *H01L 2924/1461* (2013.01); *H01L 2924/19041* (2013.01);
(Continued)

(58) Field of Classification Search
CPC ... H01L 23/481; H01L 24/11; H01L 25/0657; H01L 25/16; H01L 2224/16145; H01L 2225/06541; H01L 2225/06548; H01L 2924/12041; H01L 2924/13091
See application file for complete search history.

(56) References Cited

U.S. PATENT DOCUMENTS

2014/0077385 A1* 3/2014 Harper .................... H01L 24/17
257/774

FOREIGN PATENT DOCUMENTS

JP 2012-164970 8/2012

* cited by examiner

*Primary Examiner* — Armando Rodriguez
(74) *Attorney, Agent, or Firm* — Fish & Richardson P.C.

(57) ABSTRACT

A semiconductor device includes a semiconductor chip including a semiconductor substrate, an element formed in an element forming region of the semiconductor substrate, and a through-via penetrating across a front surface and a rear surface of the semiconductor substrate while avoiding the element forming region of the semiconductor substrate to form a conductive path between the front surface and the rear surface; a circuit component mounted on a circuit component connection surface at the same side as the front surface of the semiconductor substrate of the semiconductor chip; and an external connection members formed on the rear surface of the semiconductor substrate.

19 Claims, 15 Drawing Sheets

(51) Int. Cl.
  *H01L 25/065* (2006.01)
  *G01C 19/5783* (2012.01)
  *H01L 23/00* (2006.01)
(52) U.S. Cl.
  CPC ............... *H01L 2924/19042* (2013.01); *H01L 2924/19043* (2013.01); *H01L 2924/19104* (2013.01); *H01L 2924/19105* (2013.01)

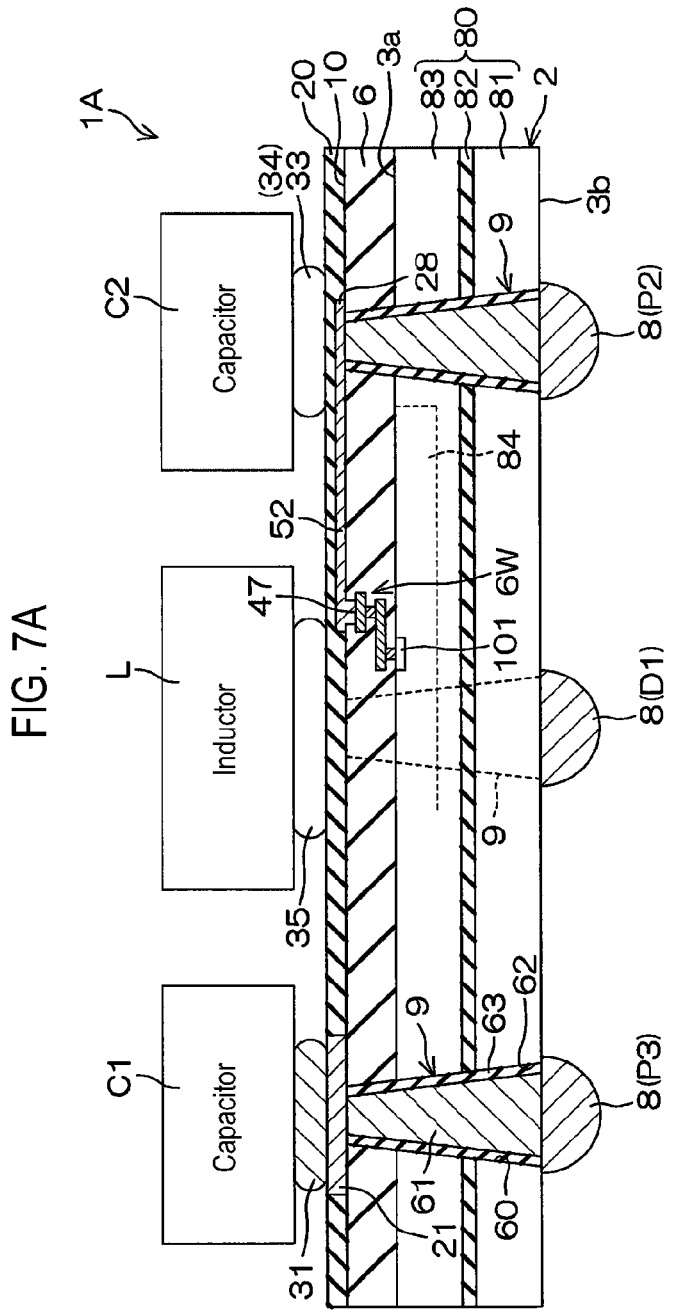

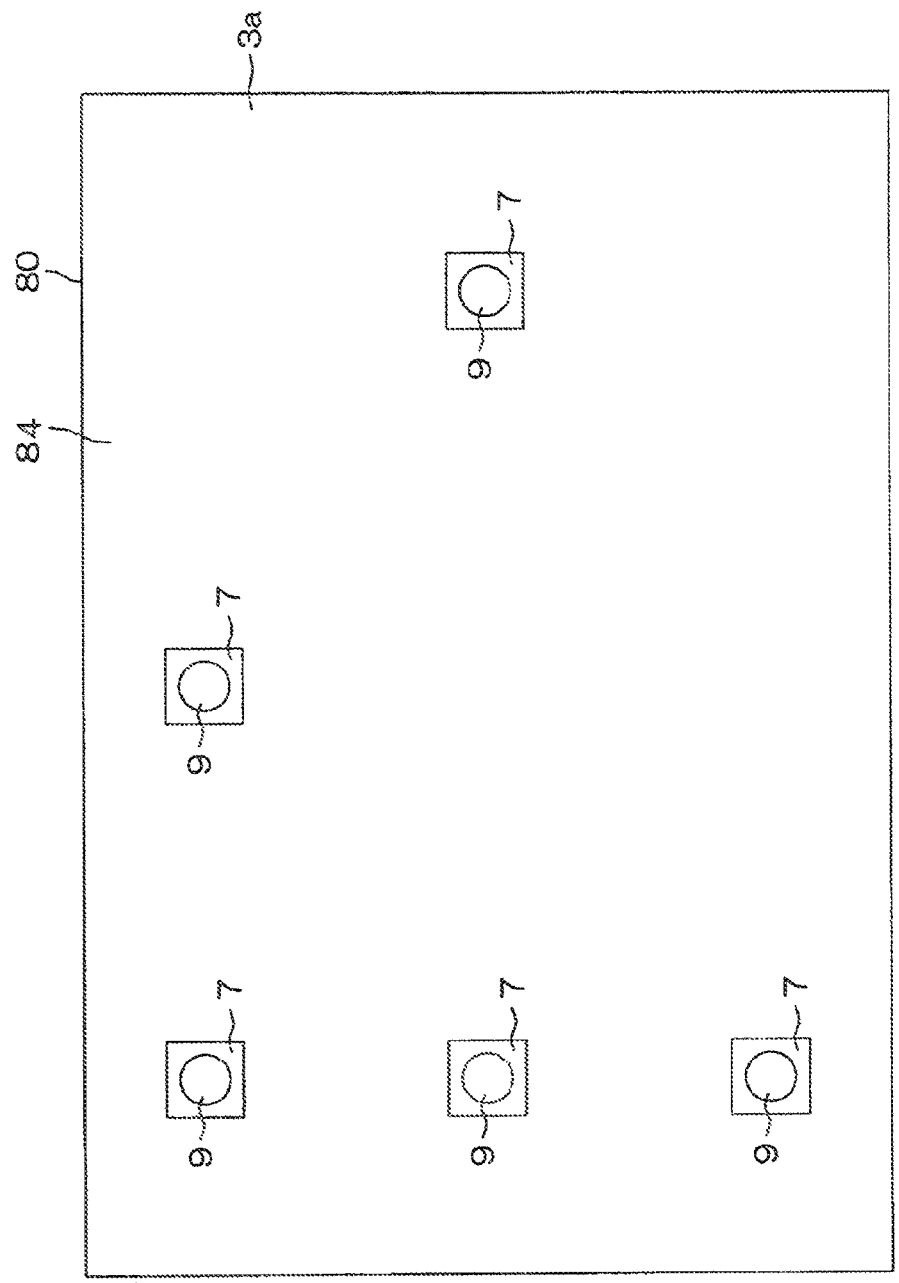

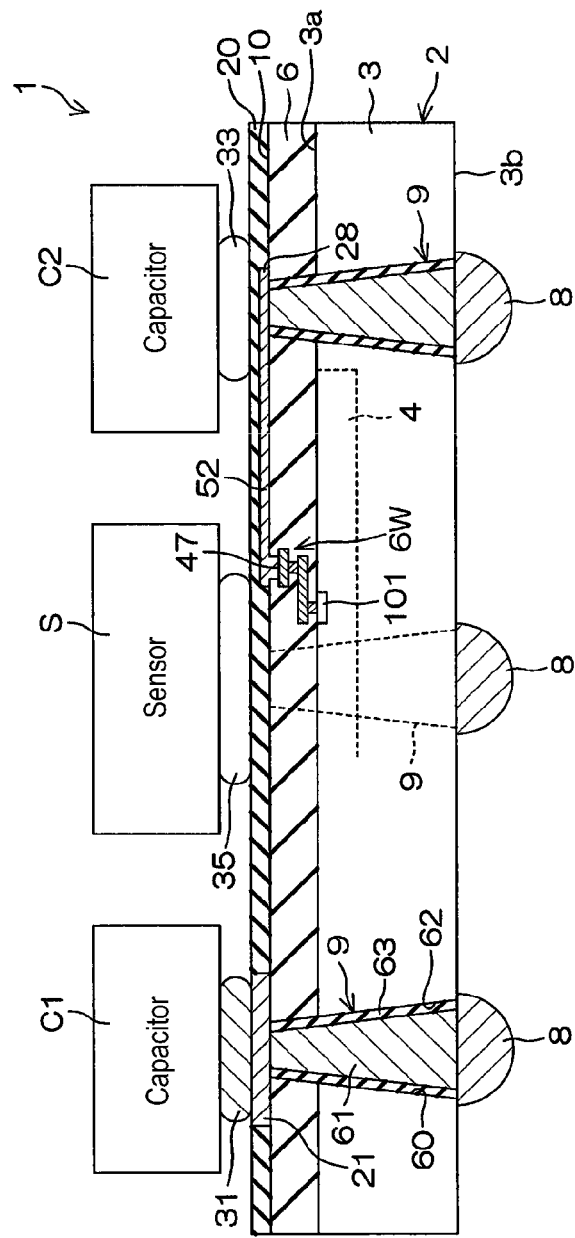

SEMICONDUCTOR DEVICE

CROSS-REFERENCE TO RELATED APPLICATIONS

This application is based upon and claims the benefit of priority from Japan Patent Applications No. 2014-32003, filed on Feb. 21, 2014, the entire contents of which are incorporated herein by reference.

TECHNICAL FIELD

The present disclosure relates to a semiconductor device in which elements are formed in an element forming region on a surface of the semiconductor substrate.

BACKGROUND

An integrated system including a semiconductor die, passive components arranged on a back side of the semiconductor die, and through-silicon vias (TSV) penetrating the semiconductor die is known. The through-silicon vias provide an electrical path for connecting the passive components to an active surface of the semiconductor die.

Since the passive components are connected to the active surface of the semiconductor die via the through-silicon vias, impedance between the active surface and the passive components is large and loss in the electrical paths therebetween is also large, due to the electrical resistance of the through-silicon vias. Accordingly, the operation speed is limited, and therefore it is difficult to achieve higher frequencies and noise is likely to enter signals transmitted via the electrical paths.

SUMMARY

The present disclosure provides some embodiments of a semiconductor device which are capable of reducing the distance between circuit components and elements formed on a surface of a semiconductor substrate and lowering electrical resistance therebetween.

According to one embodiment of the present disclosure, there is provided a semiconductor device including a semiconductor chip including a semiconductor substrate, an element formed in an element forming region of the semiconductor substrate, and a through-via penetrating across a front surface and a rear surface of the semiconductor substrate while avoiding the element forming region of the semiconductor substrate to form a conductive path between the front surface and the rear surface; a circuit component mounted on a circuit component connection surface at the same side as the front surface of the semiconductor substrate of the semiconductor chip; and an external connection member formed on the rear surface of the semiconductor substrate.

In one embodiment, the semiconductor device further includes a first surface wiring layer formed on the circuit component connection surface of the semiconductor chip to connect a circuit formed in the element forming region to the through-via. In another embodiment, the semiconductor device further includes a second surface wiring layer formed on the circuit component connection surface of the semiconductor chip to connect a circuit formed in the element forming region to an electrode of the circuit component.

In an alternate embodiment, the semiconductor device further includes a third surface wiring layer formed on the circuit component connection surface of the semiconductor chip to connect an electrode of the circuit component to the through-via. In another embodiment, the semiconductor device further includes a fourth surface wiring layer formed on the circuit component connection surface of the semiconductor chip to connect an electrode of the circuit component to another circuit component mounted on the circuit component connection surface of the semiconductor chip.

In some embodiments, an electrode of the circuit component is arranged immediately above the through-via. In other embodiments, the external connection member is arranged immediately below the through-via. In another embodiment, the semiconductor device further includes an insulating layer covering the circuit component connection surface of the semiconductor chip.

In an alternate embodiment, a space is formed between the surface of the insulating layer and the circuit component. In another embodiment, the insulating layer is a polyimide film, an oxide film, or a solder resist film. In other embodiments, the thickness of the insulating layer is equal to or greater than 10 μm.

In an alternate embodiment, the circuit component is mounted on the circuit component connection surface to overlap at least partially with the element forming region when viewed from the top. In an alternate embodiment, an electrode of the circuit component is arranged to avoid the element forming region. In another embodiment, the through-via is arranged in a region closer to the periphery of the semiconductor substrate than the element forming region. In other embodiments, the through-via is surrounded by the element forming region.

In another embodiment, the through-via is a TSV (Through-Silicon Vias). In other embodiments, the circuit component includes a capacitor chip, an inductor chip, an IC chip, a resistor chip, a diode chip, a light emitting diode element, a sensor element, or an MEMS element.

In an alternate embodiment, the circuit component includes a passive component. Examples of the passive components include a capacitor chip, an inductor chip, and a resistor chip. In one embodiment, the semiconductor substrate is a SOI (Silicon On Insulator) substrate.

According to another embodiment of the present disclosure, there is provided a semiconductor device including: a first semiconductor chip including a first semiconductor substrate, an element formed in an element forming region of the first semiconductor substrate, and a first through-via penetrating across a front surface and a rear surface of the first semiconductor substrate while avoiding the element forming region of the first semiconductor substrate to form a conductive path between the front surface and the rear surface of the first semiconductor substrate; a second semiconductor chip including a second semiconductor substrate, an element formed in an element forming region of the second semiconductor substrate, and a second through-via penetrating across a front surface and a rear surface of the second semiconductor substrate while avoiding the element forming region of the second semiconductor substrate to form a conductive path between the front surface and the rear surface of the second semiconductor substrate; a circuit component mounted on a circuit component connection surface at the same side as the front surface of the first semiconductor substrate of the first semiconductor chip; an electrical connector electrically connecting the first through-via and the second through-via between the rear surface of the first semiconductor substrate and the front surface of the second semiconductor substrate; and an external connection member formed on the rear surface of the second semiconductor substrate.

BRIEF DESCRIPTION OF THE DRAWINGS

FIG. 7A is a schematic sectional view for explaining a configuration of a semiconductor device according to another embodiment of the present disclosure.

FIG. 7B is a plan view for explaining the arrangement of a through-via region in the semiconductor device of FIG. 7A.

FIG. 13 is a sectional view illustrating a configuration of a semiconductor device where a circuit component mounted on a circuit component connection surface of a semiconductor chip includes a sensor chip, according to an embodiment of the present disclosure.

DETAILED DESCRIPTION

Figure 1:
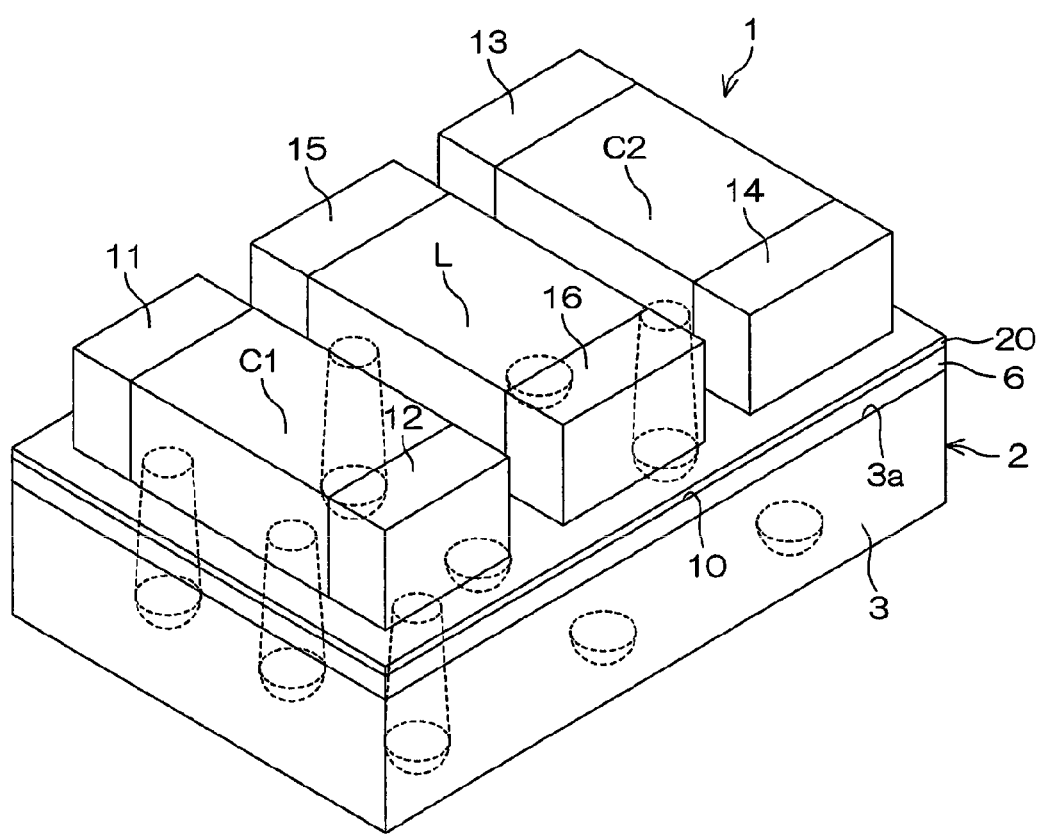
FIG. 1 is a perspective view illustrating an overall configuration of a semiconductor device according to an embodiment of the present disclosure.

Embodiments of the present disclosure will be described in detail with reference to the drawings. FIG. 1 is a perspective view illustrating an overall configuration of a semiconductor device according to an embodiment of the present disclosure. The semiconductor device 1 includes a semiconductor chip 2 and circuit components C1, C2, and L. The semiconductor chip 2 includes a semiconductor substrate 3. A multi-layered wiring layer 6 is formed on a front surface 3a of the semiconductor substrate 3. The front surface 3a of the semiconductor substrate 3 is a surface having an element forming region where elements are formed therein. The multi-layered wiring layer 6 is covered with a protection insulating film 20.

A surface of the semiconductor chip 2 at the same side as the front surface 3a of the semiconductor substrate 3 is a circuit component connection surface 10. In this embodiment, the circuit component connection surface 10 is a surface of the multi-layered wiring layer 6. The circuit components C1, C2, and L are mounted on the circuit component connection surface 10. That is, the circuit components C1, C2, and L are mounted on the surface of the semiconductor chip 2 (the circuit component connection surface 10) at the same side as the front surface 3a of the semiconductor substrate 3 on which elements are formed. In this embodiment, the capacitor chips C1 and C2, and the inductor chip L are mounted on the surface of the semiconductor chip 2 as external circuit components of the semiconductor chip 2. These circuit components are examples of passive components.

In this embodiment, the semiconductor chip 2 has a rectangular shape when viewed from the top. Two capacitor chips C1 and C2, and one inductor chip L are arranged along the long side of the semiconductor chip 2. The circuit components C1, C2, and L have a rectangular shape when viewed from the top and their long side coincides with the short side of the semiconductor chip 2. In this embodiment, one inductor chip L is interposed between two capacitor chips C1 and C2. The capacitor chips C1 and C2 include their respective electrodes 11 and 12, 13 and 14 at both ends of their long sides. Similarly, the inductor chip L includes electrodes 15 and 16 at both ends of its long side.

Figure 2:
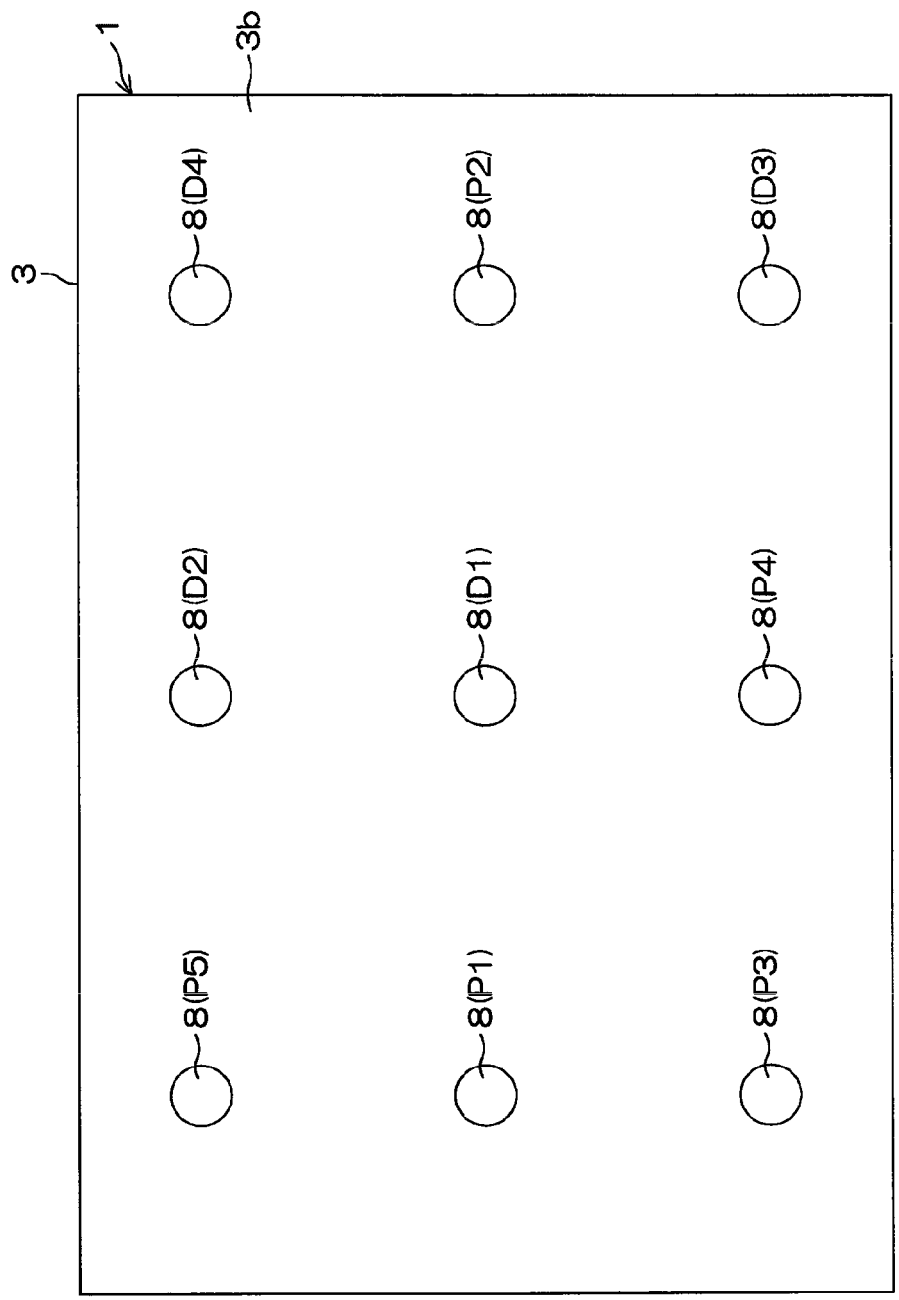
FIG. 2 is a bottom view of a semiconductor device according to an embodiment of the present disclosure.

FIG. 2 is a bottom view of the semiconductor device 1 according to an embodiment of the present disclosure. The semiconductor substrate 3 has a rear surface 3b in the opposite side of the front surface 3a provided with an element forming region 4. External connection members 8 are arranged on the rear surface 3b. The external connection members 8 may be solder balls. In this embodiment, a plurality of external connection members 8 (e.g., 9 external connection members) is arranged in the form of an array (or a matrix) on the rear surface 3b of the semiconductor substrate 3. Some of the external connection members 8 may be external connection terminals P1 to P5 that are electrically connected to a wiring board on which the semiconductor device 1 is mounted, and the other external connection members may be dummy terminals D1 to D4 which make no contribution to external electrical connection. The dummy terminals D1 to D4 are arranged in regions where the external connection terminals P1 to P5 are not arranged, and make a contribution to uniform arrangement of the entire external connection members 8.

Figure 3:
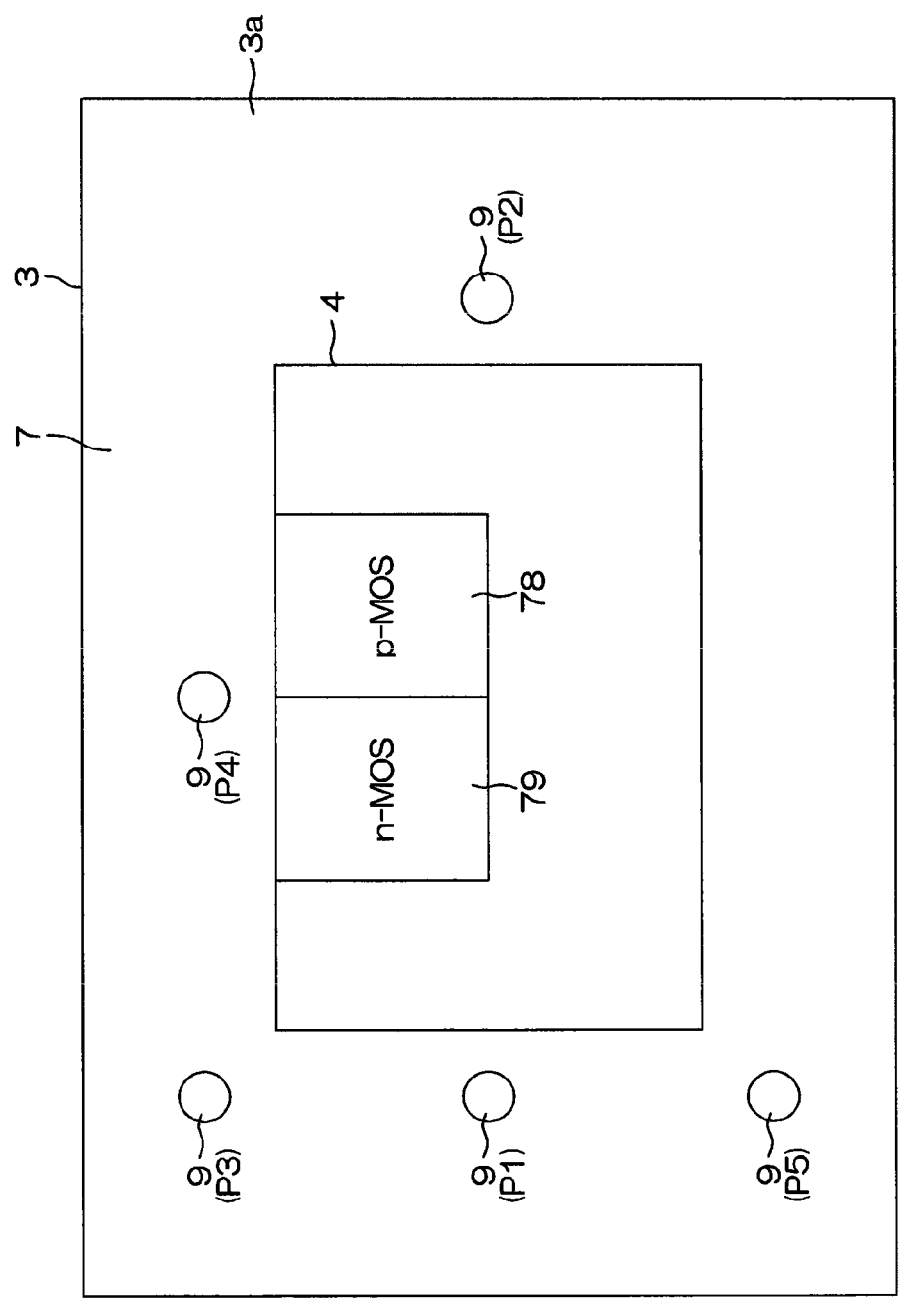
FIG. 3 is a plan view illustrating an arrangement of an element forming region of a surface of a semiconductor substrate included in a semiconductor device, according to an embodiment of the present disclosure.

FIG. 3 is a plan view illustrating an exemplary arrangement of the element forming region 4 of the surface of the semiconductor substrate 3, according to an embodiment of the present disclosure. In this example, the element forming region 4 is a band-like rectangular region extending along the long side of the semiconductor substrate 3. In this exemplary arrangement, the short side length of the element forming region 4 is shorter than that of the semiconductor substrate 3, and the long side length of the element forming region 4 is shorter than that of the semiconductor substrate 3. Elements such as a p type MOSFET (Metal-Oxide-Semiconductor Field Effect Transistor) 78, an n type MOSFET 79, etc. are formed on the element forming region 4. In the example of FIG. 3, the p type MOSFET 78 and the n type MOSFET 79 are arranged along one of the long sides of the element forming region 4.

A through-via region 7 is formed around the element forming region 4. In this embodiment, the through-via region 7 is a rectangular annular region extending along the long side of the semiconductor substrate 3. Through-vias 9 penetrating through the front surface 3a and the rear surface 3b of the semiconductor substrate 3 are arranged in the through-via region 7. By such arrangement, the through-vias 9 are formed to avoid the element forming region 4. In this embodiment, the through-vias 9 penetrate through the front surface of the semiconductor chip 2 (the circuit component connection surface 10) and the rear surface of the semiconductor chip 2 (the rear surface 3b of the semiconductor substrate 3).

Figure 4:
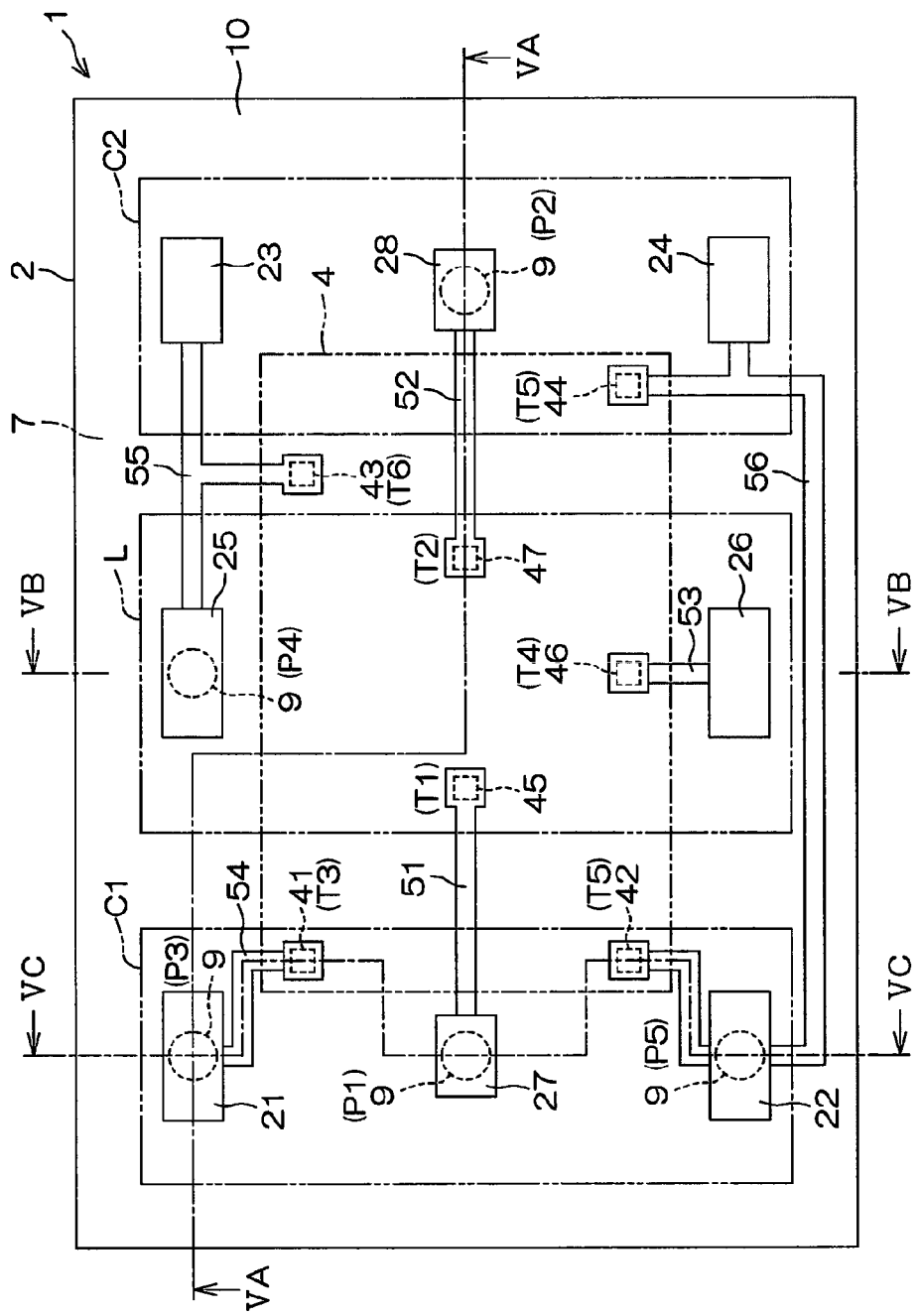
FIG. 4 is a plan view for explaining electrical connections between circuit components and an element forming region, according to an embodiment of the present disclosure.
Figure 5A:
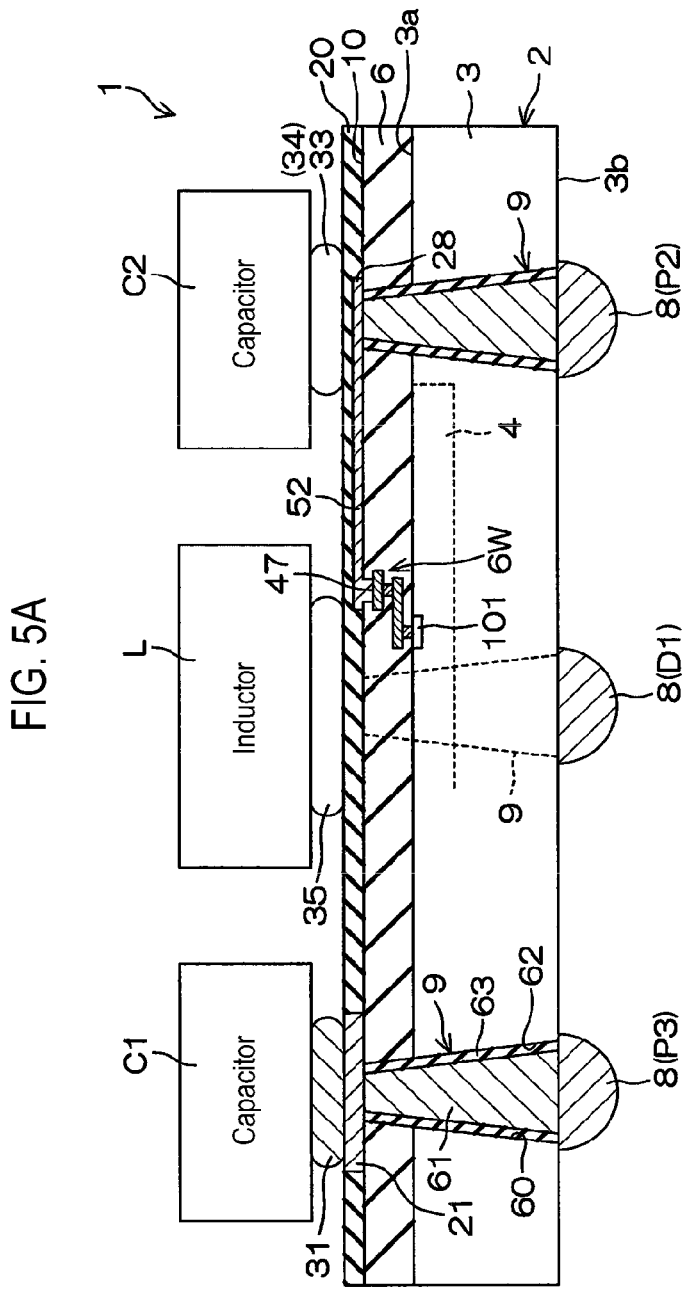
FIG. 5A is a sectional view of the semiconductor device, which is taken along line VA-VA of FIG. 4.
Figure 5B:
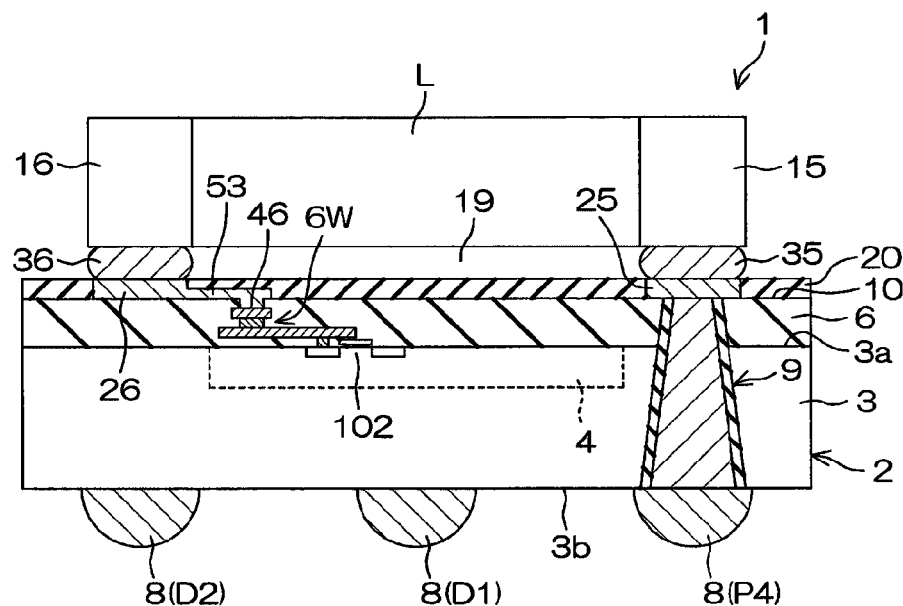
FIG. 5B is a sectional view of the vicinity of an inductor chip, which is taken along line VB-VB of FIG. 4.
Figure 5C:
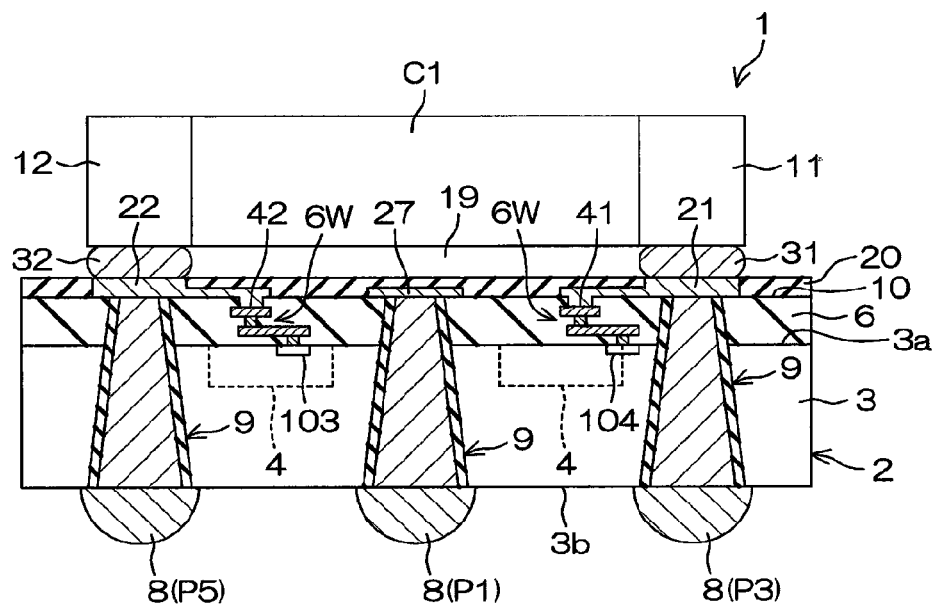
FIG. 5C is a sectional view of the vicinity of a capacitor chip, which is taken along line VC-VC of FIG. 4.

FIG. 4 is a plan view illustrating the circuit component connection surface 10 of the semiconductor chip 2, and shows electrical connection of the circuit components C1, C2, and L with the element forming region 4, according to an embodiment of the present disclosure. FIG. 5A is a sectional view of the semiconductor device 1, which is taken along line VA-VA of FIG. 4. FIG. 5B is a sectional view of the semiconductor device 1 in the vicinity of inductor chip L, which is taken along line VB-VB of FIG. 4. FIG. 5C is a sectional view of the semiconductor device 1 in the vicinity of capacitor chip C1, which is taken along line VC-VC of FIG. 4. However, the internal structures of the circuit components C1, C2, and L are not shown in FIGS. 5A, 5B, and 5C.

The semiconductor chip 2 includes the multi-layered wiring layer 6 formed on the front surface 3a of the semiconductor substrate 3. The outermost surface of the multi-layered wiring layer 6 is the circuit component connection surface 10, and the circuit component connection surface 10 is covered with the protection insulating film 20. A plurality of surface electrodes 21 to 26 is installed so that the electrodes are exposed from the insulating film 20. The plurality of surface electrodes 21 to 26 is responsible for the electrical connection between the circuit components C1, C2, and L and a circuit formed in the element forming region 4 of the semiconductor substrate 3. In particular, the pair of electrodes 15 and 16 of the inductor chip L makes mechanical and electrical connection to the surface electrodes 25 and 26 of the semiconductor chip 2 via electrically conductive bonding materials 35 and 36 such as solder, respectively. In addition, the pair of electrodes 11 and 12 of the capacitor chip C1 makes mechanical and electrical connection to the surface electrodes 21 and 22 of the semiconductor chip 2 via electrically conductive bonding materials 31 and 32 such as solder, respectively. Similarly, the pair of electrodes 13 and 14 of the capacitor chip C2 makes mechanical and electrical connection to the surface electrodes 23 and 24 of the semiconductor chip 2 via electrically conductive bonding materials 33 and 34 such as solder, respectively.

The through-vias 9 penetrating across the front surface 3a and the rear surface 3b of the semiconductor substrate 3 are arranged in the through-via region 7. In this embodiment, the through-vias 9 penetrate across the front surface and the rear surface of the semiconductor chip 2. The semiconductor substrate 3 is, for example, a silicon substrate and the through-vias 9 may be so-called through-silicon vias (TSV). As shown in FIG. 5A, each of the through-vias 9 includes a though-hole 60 formed in the semiconductor substrate 3 and a conductor 61 filled in the through-hole 60, and provides an electrically conductive path electrically connecting between the front surface 3a and rear surface 3b of the semiconductor substrate 3 (in this embodiment, between the front surface and the rear surface of the semiconductor chip 2). In this embodiment, the through-hole 60 has a tapered side wall 62 whose hole diameter increases from the front surface 3a toward the rear surface 3b. Thus, the sectional area at the rear surface 3b is larger than the sectional area at the front surface 3a. An insulating film 63 is formed on the side wall 62 of the through-hole 60, and the conductor 61 is surrounded by the insulating film 63. The insulating film 63 provides electrical isolation between the conductor 61 and the semiconductor substrate 3.

Surface electrodes 21, 22, 25, 27, and 28 are formed on the surface (the circuit component connection surface 10) of the multi-layered wiring layer 6 so as to be in contact with heads of the through-vias 9. The through-vias 9 are electrically connected to the circuit components C1, C2, and L or components in the element forming region 4 via the surface electrodes 21, 22, 25, 27, and 28. The surface electrodes 27 and 28 may not be exposed from the insulating film 20, while the surface electrodes 21 to 26 are exposed from the insulating film 20 for connection with the electrodes 11 to 16 of the circuit components C1, C2, and L.

External connection members 8 are arranged immediately below the through-vias 9 in contact with the bottoms of the through-vias 9. The external connection members 8 in contact with the bottoms of the through-vias 9 are external connection terminals P1 to P5 responsible for external electrical connection. External connection members 8 arranged in a region where the through-vias 9 are not formed are dummy terminals D1 to D4 that are not responsible for external electrical connection. In this embodiment, the external connection members 8 are arranged in the form of a 3×3 matrix, and the through-vias 9 are respectively arranged at positions corresponding to five connection members 8.

Elements 101 to 104 are formed in the element forming region 4 of the front surface 3a of the semiconductor substrate 3. The elements 101 to 104 may be either active elements or passive elements. Examples of the active elements may include transistors and diodes. These active elements, for example, may include an impurity diffusion layer formed in the surface region of the semiconductor substrate 3. Examples of the passive elements may include capacitors and resistors.

A wiring layer 6W formed in the multi-layered wiring layer 6 is responsible for connection between the elements 101 to 104 and the surface electrodes 21 to 28. Elements such as capacitors and polysilicon resistors may be formed in the multi-layered wiring layer 6. The wiring layer 6W in the multi-layered wiring layer 6 may also be used to achieve connection between elements in the multi-layered wiring layer 6, connection between elements in the multi-layered wiring layer 6 and elements in the element forming region 4, and connection between elements in the multi-layered wiring layer 6 and the surface electrodes 21 to 28.

The multi-layered wiring layer 6 has pads 41 to 47 formed by exposing portions of the wiring layer 6W. A surface wiring layer 50 formed of conductive material such as copper or the surface electrodes 21 to 28 is formed to be bonded to the pads 41 to 47. The surface wiring layer 50 and the surface electrodes 21 to 28 are formed on the circuit component connection surface 10, which is the surface of the multi-layered wiring layer 6. The surface wiring layer 50 and the surface electrodes 27 and 28 are covered by the protection insulating film 20. The surface electrodes 21 to 26 are exposed from the insulating film 20.

The insulating film 20 may be formed with a polyimide film, an oxide film, or a solder resist film. The thickness of the insulating film 20 in some embodiments is preferably 10 μm or more. Space 19 (see FIGS. 5B and 5C) is formed between the surface of the insulating film 20 and the opposite surface of the circuit components C1, C2, and L. The surface wiring layer 50 includes element-through-via surface wiring layers 51, 52, and 55 (first surface wiring layers) respectively connecting between a circuit including the element 101, etc., formed in the element forming region 4 and the surface electrodes 27 and 28 connected to the through-vias 9. In addition, the surface wiring layer 50 includes an inductor-element surface wiring layer 53 (second surface wiring layer) connecting between the surface electrode 26 connected to the inductor chip L and a circuit including the element 102, etc., formed in the element forming region 4. Further, the surface wiring layer 50 includes a capacitor-element surface wiring layer 54 (second surface wiring layer) connecting between the surface electrode 21 connected to the capacitor chip C1 and a circuit including the element 104, etc., formed in the element forming region 4. Additionally, the surface wiring layer 50 includes an inductor-capacitor surface wiring layer 55 (fourth surface wiring layer) connecting between the surface electrode 25 connected to the inductor chip L and the surface electrode 23 connected to the capacitor chip C2. The surface wiring layer 55 functions as the element-through-via surface wiring layer (first surface wiring layer) and the inductor-capacitor surface wiring layer (fourth surface wiring layer). In addition, the surface wiring layer 50 includes a capacitor-capacitor surface wiring layer 56 (fourth front surface wiring layer) connecting between the surface electrodes 22 and 24 respectively connected to the capacitor chips C1 and C2.

The surface electrodes 21, 22, and 25 formed between the electrodes 11, 12, and 15 of the circuit components C1, C2, and L and the through-vias 9 also functions as a surface wiring layer (third surface wiring layer) connecting between the circuit components C1, C2, and L and the corresponding through-vias 9.

Figure 6:
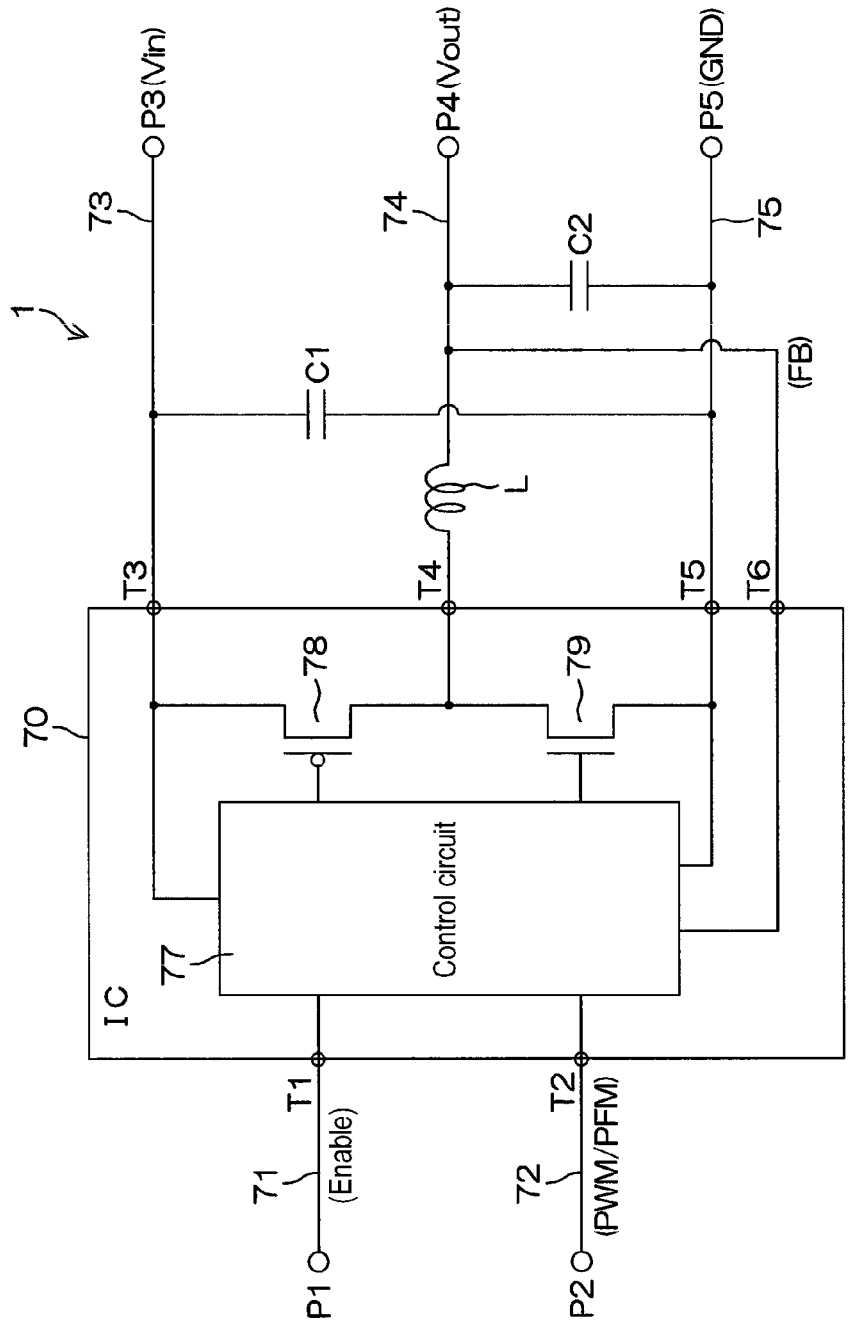
FIG. 6 is an electrical circuit diagram for explaining an electrical configuration of a semiconductor device, according to an embodiment of the present disclosure.

FIG. 6 is an electrical circuit diagram for explaining an electrical configuration example of the semiconductor device 1, according to an embodiment of the present disclosure. The semiconductor device 1 includes an integrated circuit 70 including the elements 101 to 104 formed in the element forming region 4, and the inductor chip L and the capacitor chips C1 and C2 connected to the integrated circuit 70. For example, the semiconductor device 1 may be a power supply voltage generating circuit.

The integrated circuit 70 includes a control circuit 77, a p type MOSFET 78, an n type MOSFET 79, and terminals T1 to T6. The terminals T1 and T2 are connected to the control circuit 77. The terminal T1 may be an on/off control signal input terminal (enable terminal) for switching on/off a power supply voltage output. The terminal T2 may be a mode switching control signal input terminal for switching an operation mode between a PWM (Pulse Width Modulation) mode and a PFM (Pulse Frequency Modulation) mode. The terminal T3 may be an input terminal to which an input voltage Vin is applied. The terminal T4 may be a switching terminal for supplying voltage to the inductor chip L. The terminal T5 may be a ground terminal connected to a ground potential GND. The terminal T6 may be a feedback terminal for feeding back the output voltage. The control circuit 77 is operated with power fed from the terminal T3. The p type MOSFET 78 and the n type MOSFET 79 are connected in series between the voltage input terminal T3 and the ground terminal T5. The switching terminal T4 is connected between the p type MOSFET 78 and the n type MOSFET 79. The feedback terminal T6 is connected to the control circuit 77. The control circuit 77 inputs respective control signals to the gates of the p type MOSFET 78 and the n type MOSFET 79 while monitoring the voltage input to the feedback terminal T6.

External connection terminals P1 and P2 are connected to the control signal input terminals T1 and T2 of the integrated circuit 70 via electrical paths 71 and 72 formed by the multi-layered wiring layer 6, the surface wiring layer 50, and the through-vias 9. Further, an external connection terminal P3 is connected to the voltage input terminal T3 of the integrated circuit 70 via an electrical path 73 formed by the multi-layered wiring layer 6, the surface wiring layer 50, and the through-vias 9. In addition, one terminal (electrode 16) of the inductor chip L is connected to the switching terminal T4 of the integrated circuit 70 via the multi-layered wiring layer 6 and the surface wiring layer 50. The other terminal (electrode 15) of the inductor chip L is connected to an external connection terminal P4 via an electrical path 74 formed by the surface wiring layer 50, the through-vias 9, etc. An external connection terminal P5 is connected to the ground terminal T5 of the integrated circuit 70 via an electrical path 75 formed by the multi-layered wiring layer 6, the surface wiring layer 50, and the through-vias 9. The feedback terminal T6 of the integrated circuit 70 is connected to the other terminal (electrode 15) of the inductor chip L via an electrical path 76 formed by the multi-layered wiring layer 6, the surface wiring layer 50, etc.

The capacitor chip C1 is connected between the electrical paths 73 and 75, and the capacitor chip C2 is connected between the electrical paths 74 and 75. The terminal P5 may be a ground terminal connected to the ground potential. This power supply voltage generating circuit may be operated to convert the input voltage (e.g., 5 V) input to the terminal P3 into a predetermined voltage (e.g., 1 V) and output the predetermined voltage to the terminal P4.

As shown in FIG. 4, the surface wiring layer 51 is formed in a straight line, with one end connected to the pad 45 corresponding to the on/off control signal input terminal T1 and the other end connected to a through-via 9 corresponding to the external connection terminal P1 via the surface electrode 27. In addition, the surface wiring layer 52 is formed in a straight line, with one end connected to the pad 47 corresponding to the mode switching control signal input terminal T2 and the other end connected to a through-via 9 corresponding to the external connection terminal P2 via the surface electrode 28. The surface wiring layer 53 is formed in a straight line, with one end connected to the pad 46 corresponding to the switching terminal T4 and the other end connected to the surface electrode 26 corresponding to the electrode 16 of the inductor chip L. The surface wiring layer 54 is formed in a crank shape, with one end connected to the pad 41 corresponding to the input terminal T3 and the other end connected to a through-via 9 corresponding to the external connection terminal P3 via the surface electrode 21. The surface wiring layer 55 is formed in a T-like shape having a straight line and a branch portion branched from the middle of the straight line. One end of the straight line is connected to the surface electrode 23 corresponding to the electrode 13 of the capacitor chip C2 and the other end is connected to a through-via 9 corresponding to the external connection terminal P4 via the surface electrode 25. In addition, a leading part of the branch portion of the surface wiring layer 55 is connected to the pad 43 corresponding to the feedback terminal T6. The surface wiring layer 56 has one end and another end respectively connected to the pads 42 and 44 corresponding to the ground terminal T5, and is formed in a U-like pattern extending to bypass the region of the inductor chip L. Further, the surface electrode 22 corresponding to the electrode 12 of the capacitor chip C1 is disposed in the middle part biased to one end of the surface wiring layer 56. In addition, the surface wiring layer 56 has a branch portion in the vicinity of the pad 44 and a leading part of the branch portion is connected to the surface electrode 24 corresponding to the electrode 14 of the capacitor chip C2.

Passive components (the capacitor chips C1 and C2, and the inductor chip L) are connected to the external terminal P3 (power supply voltage terminal) connected to the input terminal T3, the external terminal P4 (output voltage terminal from which an output voltage Vout is derived) connected to the switching terminal T4 via the inductor chip L, and the external terminal P5 (ground terminal) connected to the ground terminal T5. The external connection terminals P3, P4, and P5 are arranged in a long side (or near the long side) of the semiconductor chip 2. This facilitates arrangement of the passive components along the short side of the semiconductor chip 2. On the other hand, it is preferable in some embodiments to construct the external terminals P1 and P2 (signal input terminals) connected to the control signal input terminals T1 and T2 as external connection members 8 that are not arranged along the long side of the semiconductor substrate 3, among the external connection members 8 arranged on the rear surface 3b of the semiconductor substrate 3. In particular, as shown in FIG. 4, it is preferable to construct the external terminals P1 and P2 as signal input terminals, as an external connection member 8 near the middle of one short side of the semiconductor substrate 3 and an external connection member 8 near the middle of the other short side of the semiconductor substrate 3.

According to the above embodiment, elements are formed in the element forming region 4 of the front surface 3a of the semiconductor substrate 3. The surface of the semiconductor chip 2, which is at the same side as the front surface 3a, corresponds to the circuit component connection surface 10, and the circuit components C1, C2, and L are arranged on the circuit component connection surface 10. This makes it possible to reduce the distance between elements formed in the semiconductor substrate 3 and the circuit components C1, C2, and L, thereby lowering resistance of the electrical paths therebetween. As a result, loss in the electrical paths between a circuit in the semiconductor substrate 3 and the circuit components C1, C2, and L may be reduced, which may result in achievement of higher frequencies and improvement of noise resistance.

The connection of the semiconductor device 1 and external elements is achieved by the external connection members 8 arranged on the rear surface 3b of the semiconductor substrate 3. The external connection members 8 may be connected to an electrical circuit including the elements formed in the semiconductor substrate 3 and the circuit components C1, C2, and L via the through-vias 9 forming conductive paths between the front surface 3a and rear surface 3b of the semiconductor substrate 3. Although the through-vias 9 are arranged to avoid the element forming region 4, the circuit components C1, C2, and L may be arranged to overlap with some or all of the through-vias 9. This makes it possible to reduce the distance between the circuit components C1, C2, and L and the through-vias 9, thereby lowering resistance of electrical paths therebetween. More specifically, in this embodiment, the electrodes 11, 12, and 15 of the circuit components C1, C2, and L are disposed immediately above the through-vias 9. This may minimize the length of the electrical paths between the circuit components C1, C2, and L and the through-vias 9.

In addition, in this embodiment, the external connection members 8 configuring the external connection terminals P1 to P5, which are used for electrical connection with external elements, are disposed immediately below the through-vias 9. This may minimize the length of the electrical paths between the through-vias 9 and the external connection members 8. In addition, in this embodiment, the circuit component connection surface 10 of the semiconductor chip 2 is covered by the insulating film 20. This may provide sufficient protection to the semiconductor chip 2. The surface wiring layer 50 formed on the circuit component connection surface 10 may also be coated with the insulating film 20, thereby increasing reliability of the semiconductor device 1.

In addition, in this embodiment, the space 19 is formed between the surface of the insulating film 20 and the circuit components C1, C2, and L. This may prevent excessive stress due to a difference in thermal expansion coefficients between the circuit components C1, C2, and L and the semiconductor chip 2 from being applied to the semiconductor chip 2 and the circuit components C1, C2, and L, which provides stable characteristics. In addition, in this embodiment, the circuit components C1, C2, and L are mounted on the circuit component connection surface 10 in such a manner that these components overlap at least partially with the element forming region 4 when viewed from the top. Such arrangement may reduce the size of the semiconductor device 1 when viewed from the top, thereby reducing the area occupied by the semiconductor device 1 on a wiring board on which the semiconductor device is mounted.

In addition, in this embodiment, the terminals (electrodes 11 to 16) of the circuit components C1, C2, and L are arranged to avoid the element forming region 4 when viewed from the top. This prevents stress from the circuit components C1, C2, and L from reaching the element forming region 4, thereby providing a semiconductor device 1 having stable characteristics. In addition, in this embodiment, the through-vias 9 are arranged in a region closer to the periphery of the semiconductor substrate 3 than the element forming region 4. This allows the through-vias 9 to be separated from the element forming region 4 while securing the middle region of the semiconductor substrate 3 as the element forming region 4. In addition, by using such arrangement, the element forming region 4 may be protected when forming the through-vias 9, and thus, a semiconductor device 1 having stable characteristics may be provided.

An outline of a manufacturing process of the semiconductor device 1 will be described below. A plurality of semiconductor devices 1 is collectively manufactured on a semiconductor wafer. First, elements are formed in the element forming region 4 of a semiconductor wafer corresponding to the semiconductor substrate 3, and the multi-layered wiring layer 6 is formed. Thereafter, the through-vias 9 that may be formed with TSV are formed to avoid the element forming region 4. Next, the surface wiring layer 50 and the surface electrodes 21 to 28 are formed on the surface of the multi-layered wiring layer 6 (the circuit component connection surface 10). Then, the insulating film 20 having an opening to expose the surface electrodes 21 to 26 for connection of the circuit components C1, C2, and L is formed. Subsequently, the circuit components C1, C2, and L are automatically mounted on the circuit component connection surface 10. Specifically, solder is printed on the electrode positions and the circuit components C1, C2, and L are arranged by an automatic mounting machine. Subsequently, the external connection members 8 (e.g., solder balls) are formed on the rear surface of the semiconductor wafer. Thereafter, the semiconductor wafer is diced to be segmented into the plurality of semiconductor devices 1.

FIG. 7A is a schematic sectional view for explaining a configuration of a semiconductor device 1A according to a second embodiment of the present disclosure, which shows the same sectional plane as FIG. 5A. In FIG. 7A, parts corresponding to those shown in FIGS. 1 to 6 are denoted by the same reference numerals. In this embodiment, a semiconductor substrate 80, which may be used instead of the semiconductor substrate 3, is configured as a SOI substrate. The SOI substrate 80 is a substrate including a silicon substrate 81, an insulating layer 82 formed on a surface of the silicon substrate 81, and a semiconductor layer 83 epitaxially grown on the insulating layer 82. Elements such as transistors are formed in an element forming region 84 of the surface of the semiconductor layer 83. Through-vias 9 are formed to penetrate through the silicon substrate 81, insulating layer 82, and semiconductor layer 83 of the SOI substrate 80.

As shown in FIG. 7B, in this embodiment, a local region near each through-via 9 corresponds to a through-via region 85. That is, a plurality of through-via regions 85 is discretely arranged to correspond to a plurality of through-vias 9. A region other than the through-via region 85 is the element forming region 84 where elements are formed on the surface of the semiconductor substrate 80. That is, in this embodiment, the through-vias 9 are surrounded by the element forming region 84. Accordingly, a wider area of the semiconductor substrate 80 may be used as the element forming region 84, and thus, it is possible to implement a complicated function by forming a number of elements in the element forming region 84, or reduce the size of the semiconductor substrate by reducing the element forming region 84.

The characteristics related to the discrete arrangement of the through-via region may also be applied to the above-described first embodiment, which does not employ a SOI substrate. In addition, in the second embodiment using the SOI substrate, it is possible to arrange a through-via region around the element forming region in a similar manner as the first embodiment.

Figure 8:
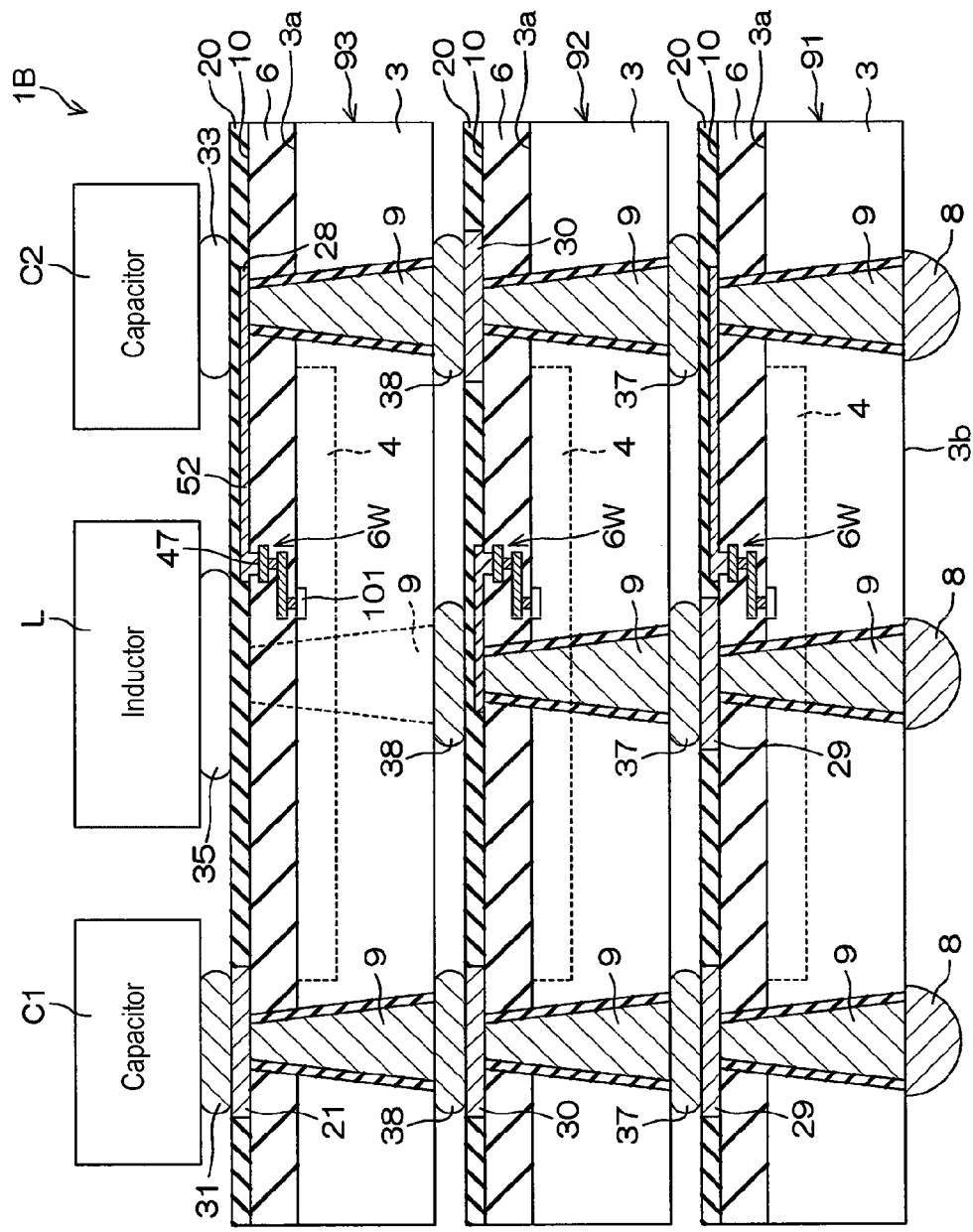
FIG. 8 is a schematic sectional view for explaining a configuration of a semiconductor device according to still another embodiment of the present disclosure.

FIG. 8 is a schematic sectional view for explaining a configuration of a semiconductor device 1B according to a third embodiment of the present disclosure, which shows the same sectional plane as FIG. 5A. In FIG. 8, parts corresponding to those shown in FIGS. 1 to 6 are denoted by the same reference numerals.

In this embodiment, a plurality of semiconductor chips 91 to 93 having the same configuration as the semiconductor chip 2 is stacked with the circuit component connection surface 10 heading in the same direction. The uppermost semiconductor chip 93 corresponds to a "first semiconductor chip" of the present disclosure. The semiconductor chips 92 and 93 correspond to "second semiconductor chips" of the present disclosure. If the semiconductor chip 93 is a "second semiconductor chip" of the present disclosure, the semiconductor chip 92 may be a third semiconductor chip constituting an electrical connector for making contribution to electrical connections between the semiconductor chips 91 and 93.

Through-vias 9 penetrating across the front surface 3a and the rear surface 3b of the semiconductor substrate 3 (more specifically, across the front surface and the rear surface of the semiconductor chip) are formed in each of the semiconductor chips 91 to 93. In the configuration of FIG. 8, through-vias 9 are formed at opposite positions of a pair of semiconductor chips adjacent to each other in the vertical direction (stacking direction of the semiconductor chips). By using such arrangement, the adjacent semiconductor chips may be interconnected with the shortest path via the through-vias 9. However, each of the semiconductor chips 91 to 93 may not have through-vias 9 at positions corresponding to through-vias 9 of different adjacent semiconductor chips or may have through-vias 9 at positions other than the corresponding positions of through-vias 9 of different adjacent semiconductor chips. In addition, through-vias 9 opposing one another in the vertical direction may or may not be electrically interconnected.

The external connection members 8 are arranged on the bottom surface (the rear surface 3b) of the lowermost semiconductor chip 91. Another semiconductor chip 92 is mounted on the circuit component connection surface 10 of the semiconductor chip 91. Further, a separate semiconductor chip 93 is connected to the circuit component connection surface 10 of the semiconductor chip 92. Circuit components C1, C2, and L are mounted on the circuit component connection surface 10 of the uppermost semiconductor chip 93. Connection between the adjacent semiconductor chips 91, 92, and 93 is achieved by using electrically conductive bonding materials 37 and 38 such as solders. The electrically conductive bonding materials 37 and 38 are in contact with the bottom portion of the through-vias 9 of the semiconductor chip located immediately above or the rear surface 3b of the semiconductor substrate 3. In addition, the electrically conductive bonding materials 37 and 38 are in contact with the surface electrodes 29 and 30 or the insulating film 20 of the semiconductor chip located immediately below.

With this configuration, it is possible to provide a semiconductor device 1B with high performance since the plurality of semiconductor chips 91 to 93 is stacked and electrically interconnected. The number of stacked semiconductor chips may be two or four or more.

FIGS. 9 to 13 illustrate exemplary configurations where different kinds of circuit components are mounted on a circuit component connection surface of the semiconductor chip 2 in the semiconductor device 1 of the first embodiment of the present disclosure. In these figures, parts corresponding to those shown in FIGS. 1 to 6 are denoted by the same reference numerals.

Figure 9:
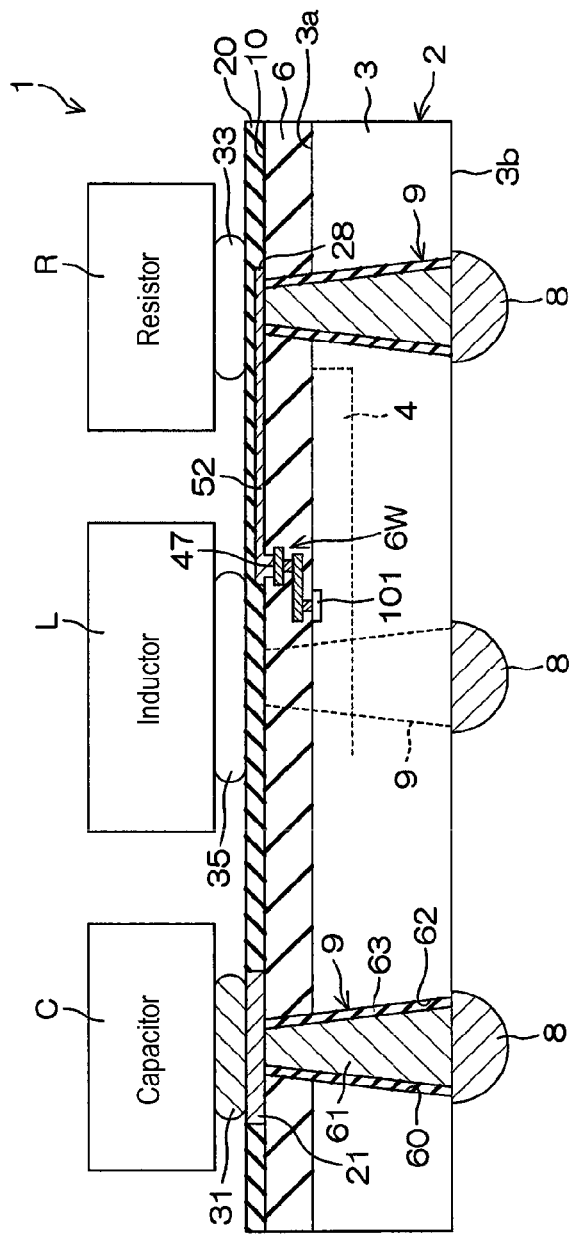
FIG. 9 is a sectional view illustrating a configuration of a semiconductor device where a circuit component mounted on a circuit component connection surface of a semiconductor chip includes a resistor chip, according to an embodiment of the present disclosure.
Figure 10:
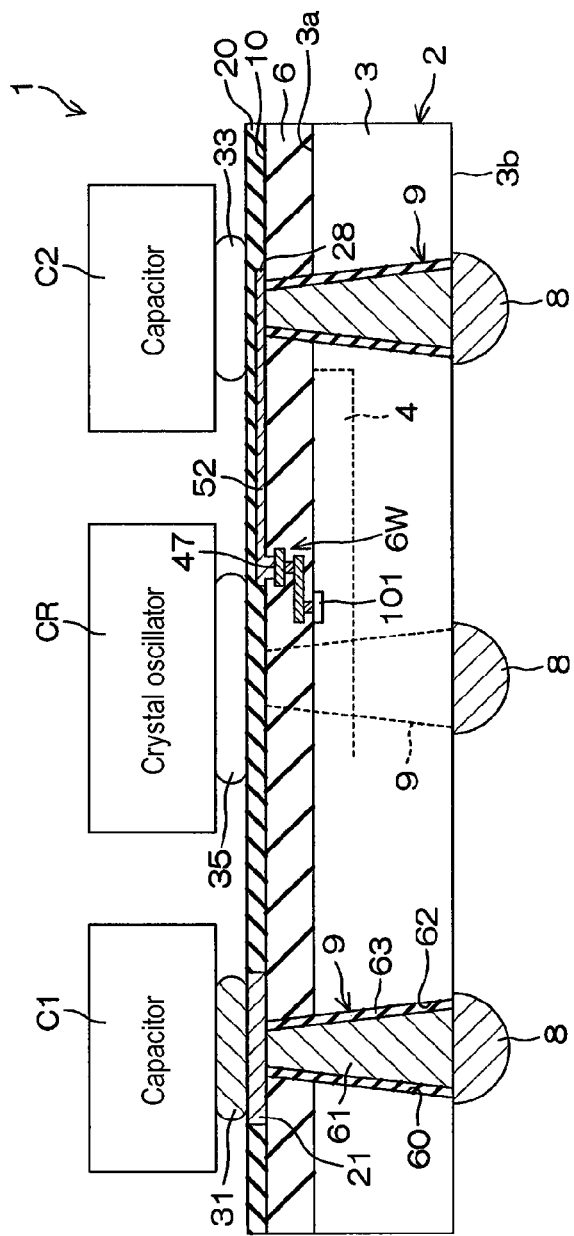
FIG. 10 is a sectional view illustrating a configuration of a semiconductor device where a circuit component mounted on a circuit component connection surface of a semiconductor chip includes a crystal oscillator chip, according to an embodiment of the present disclosure.
Figure 11:
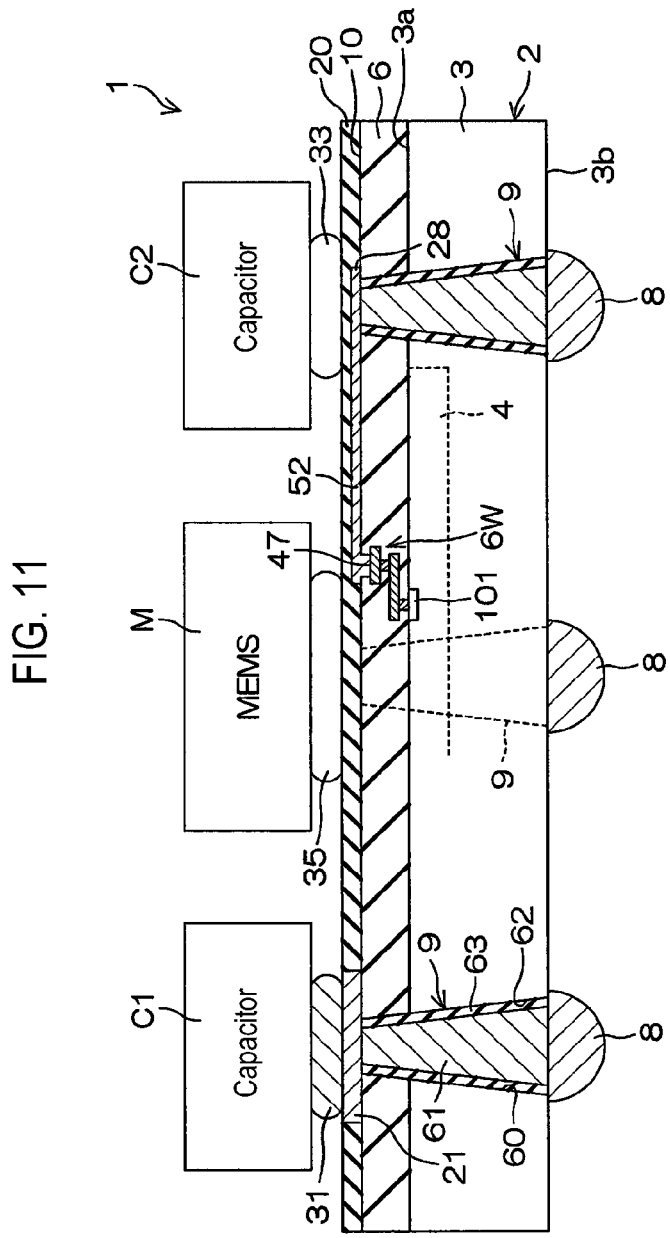
FIG. 11 is a sectional view illustrating an exemplary a configuration of a semiconductor device where a circuit component mounted on a circuit component connection surface of a semiconductor chip includes a MEMS chip, according to an embodiment of the present disclosure.

The semiconductor device 1 of FIG. 9 includes a capacitor chip C, an inductor chip L, and a resistor chip R mounted on the circuit component connection surface 10 of the semiconductor chip 2. The semiconductor device 1 of FIG. 10 includes a pair of capacitor chips C1 and C2, and a crystal oscillator chip CR mounted on the circuit component connection surface 10 of the semiconductor chip 2. The semiconductor device 1 of FIG. 11 includes a pair of capacitor chips C1 and C2, and a MEMS chip M mounted on the circuit component connection surface 10 of the semiconductor chip 2. The MEMS chip M may be a sensor such as an acceleration sensor, an angular velocity sensor, a pressure sensor, etc., or an actuator such as an inkjet head, a digital micro mirror device, etc.

Figure 12:
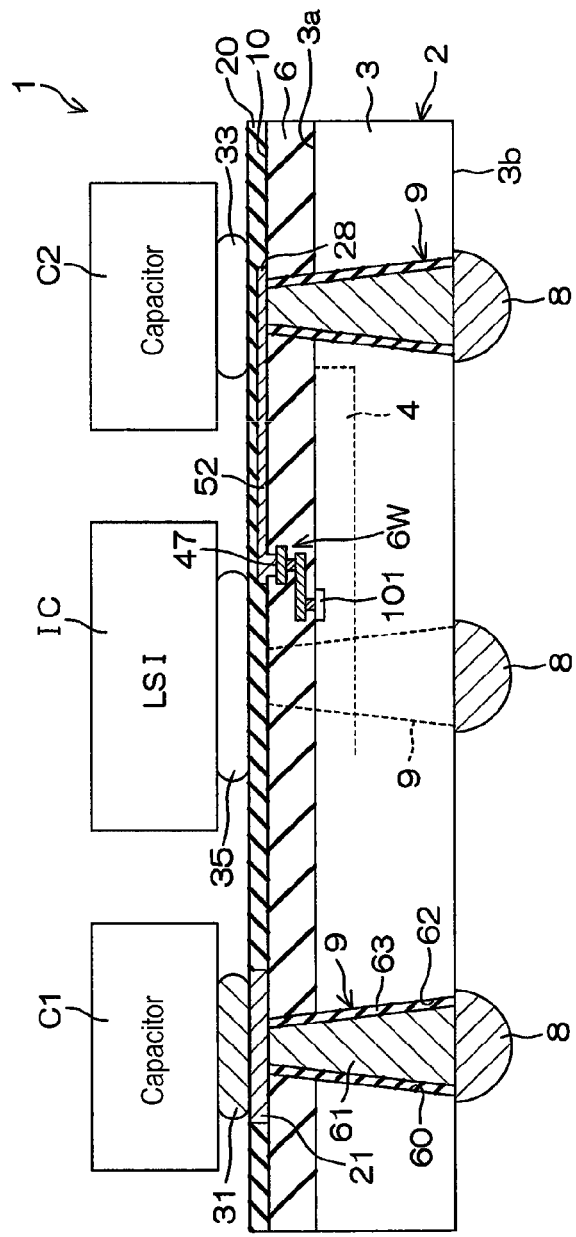
FIG. 12 is a sectional view illustrating a configuration of a semiconductor device where a circuit component mounted on a circuit component connection surface of a semiconductor chip includes an LSI chip, according to an embodiment of the present disclosure.

The semiconductor device 1 of FIG. 12 includes a pair of capacitor chips C1 and C2, and an LSI chip (IC chip) IC mounted on the circuit component connection surface 10 of the semiconductor chip 2. This may provide a semiconductor device with more complicated functions. The semiconductor device 1 of FIG. 13 includes a pair of capacitor chips C1 and C2, and a sensor chip S mounted on the circuit component connection surface 10 of the semiconductor chip 2. The sensor chip S may be, for example, a temperature sensor, a pressure sensor, etc.

Circuit components mounted on the circuit component connection surface 10 of the semiconductor device 1A shown in FIG. 7A and the semiconductor device 1B shown in FIG. 8 may have the same configuration as described above. Although embodiments of the present disclosure have been described above, the present disclosure may be implemented in different forms. For example, circuit components such as a capacitor chip, an inductor chip, an IC chip, a resistor chip, a diode chip, a light emitting diode element, a sensor element, an MEMS element, etc., may be mounted on the circuit component connection surface alone or in combination with the same chip or element. In addition, different kinds of circuit components in any combination may be mounted on the circuit component connection surface. The number of circuit components mounted on the circuit component connection surface is not limited to the above-embodiments and any suitable number of circuit components may be mounted on the circuit component connection surface.

In addition, although FIG. 4 illustrates that the annular through-via region 7 is formed to surround the element forming region 4, the element forming region may also be formed, for example, in a strip shape extending in the long side of the semiconductor substrate 3, and a pair of strip shaped through-via regions may be formed on both sides thereof. Further, the through-via region may be formed only in one side of the strip shaped element forming region. In addition, although it has been illustrated in the above-described embodiments that the semiconductor substrate is made of silicon, the semiconductor substrate may also be made of compound semiconductors such as SiC and GaN, instead of silicon.

The designs of the present disclosure may also be modified in various ways within the scope of subject matters defined in the claims.

According to the present disclosure, elements are formed in the element forming region of the front surface of the semiconductor substrate, the surface of the semiconductor chip, which is at the same side as the front surface, corresponds to the circuit component connection surface, and the circuit components are arranged on the circuit component connection surface. This makes it possible to reduce the distance between elements formed in the semiconductor substrate and the circuit components, thereby lowering resistance of the electrical paths therebetween. As a result, loss in the electrical paths may be reduced, which may result in achievement of higher frequencies and improvement of noise resistance.

The connection of the semiconductor device and external elements is achieved by the external connection members arranged on the rear surface of the semiconductor substrate. The external connection members may be connected to an electrical circuit including the elements formed in the semiconductor substrate and the circuit components via the through-vias forming conductive paths between the front surface and rear surface of the semiconductor substrate. Although the through-vias are arranged to avoid the element forming region, the circuit components may be arranged to overlap with some or all of the through-vias.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
a first semiconductor chip including a first semiconductor substrate, an element formed in an element forming region of the first semiconductor substrate, and a first through-via penetrating across a front surface and a rear surface of the first semiconductor substrate while avoiding the element forming region of the first semiconductor substrate to form a conductive path between the front surface and the rear surface of the first semiconductor substrate;
a second semiconductor chip including a second semiconductor substrate, an element formed in an element forming region of the second semiconductor substrate, and a second through-via penetrating across a front surface and a rear surface of the second semiconductor substrate while avoiding the element forming region of the second semiconductor substrate to form a conductive path between the front surface and the rear surface of the second semiconductor substrate;
a circuit component mounted on a circuit component connection surface at the same side as the front surface of the first semiconductor substrate of the first semiconductor chip;
an electrical connector electrically connecting the first through-via and the second through-via between the rear surface of the first semiconductor substrate and the front surface of the second semiconductor substrate; and
an external connection member formed on the rear surface of the second semiconductor substrate.

2. The semiconductor device of claim 1, further comprising a surface wiring layer formed on the circuit component connection surface of the first semiconductor chip to connect a circuit formed in the element forming region of the first semiconductor substrate to the first through-via.

3. The semiconductor device of claim 1, further comprising a surface wiring layer formed on the circuit component connection surface of the first semiconductor chip to connect the circuit formed in the element forming region of the first semiconductor substrate to an electrode of the circuit component.

4. The semiconductor device of claim 1, further comprising a surface wiring layer formed on the circuit component connection surface of the first semiconductor chip to connect the electrode of the circuit component to the first through-via.

5. The semiconductor device of claim 1, further comprising a surface wiring layer formed on the circuit component connection surface of the first semiconductor chip to connect the electrode of the circuit component to another circuit component mounted on the circuit component connection surface of the first semiconductor chip.

6. The semiconductor device of claim 1, wherein an electrode of the circuit component is arranged immediately above the first through-via.

7. The semiconductor device of claim 1, wherein the external connection member is arranged immediately below the first through-via.

8. The semiconductor device of claim 1, further comprising an insulating layer covering the circuit component connection surface of the first semiconductor chip.

9. The semiconductor device of claim 8, wherein a space is formed between a surface of the insulating layer and the circuit component.

10. The semiconductor device of claim 8, wherein the insulating layer is a polyimide film, an oxide film, or a solder resist film.

11. The semiconductor device of claim 8, wherein a thickness of the insulating layer is equal to or greater than 10 µm.

12. The semiconductor device of claim 1, wherein the circuit component is mounted on the circuit component connection surface of the first semiconductor chip to overlap at least partially with the element forming region of the first semiconductor substrate when viewed from the top.

13. The semiconductor device of claim 1, wherein an electrode of the circuit component is arranged to avoid the element forming region of the first semiconductor substrate.

14. The semiconductor device of claim 1, wherein the first through-via is arranged in a region closer to a periphery of the first semiconductor substrate than the element forming region of the first semiconductor substrate.

15. The semiconductor device of claim 1, wherein the first through-via is surrounded by the element forming region of the first semiconductor substrate.

16. The semiconductor device of claim 1, wherein the first through-via is a TSV (Through-Silicon Via).

17. The semiconductor device of claim 1, wherein the circuit component includes a capacitor chip, an inductor chip, an IC chip, a resistor chip, a diode chip, a light emitting diode element, a sensor element, or an MEMS element.

18. The semiconductor device of claim 1, wherein the circuit component includes a passive component.

19. The semiconductor device of claim 1, wherein the semiconductor substrate is a SOI substrate.

* * * * *